United States Patent [19]

Wade et al.

[11] Patent Number: 5,287,386
[45] Date of Patent: Feb. 15, 1994

[54] DIFFERENTIAL DRIVER/RECEIVER CIRCUIT

[75] Inventors: Jon P. Wade, Cambridge; David S. Wells, Bolton, both of Mass.

[73] Assignee: Thinking Machines Corporation, Cambridge, Mass.

[21] Appl. No.: 676,132

[22] Filed: Mar. 27, 1991

[51] Int. Cl.$^5$ .............................................. H04B 3/00
[52] U.S. Cl. ........................................ 375/36; 375/60
[58] Field of Search .................. 375/7, 17, 36, 60, 99; 307/443

[56] References Cited

U.S. PATENT DOCUMENTS

| | | | |
|---|---|---|---|
| 4,083,005 | 4/1978 | Looschen | 375/36 |
| 4,083,010 | 4/1978 | Looschen | 375/36 |
| 5,051,110 | 10/1991 | Fu et al. | 375/36 |

Primary Examiner—Curtis Kuntz
Assistant Examiner—T. Ghebretinsae
Attorney, Agent, or Firm—Richard A. Jordan

[57] ABSTRACT

A new driver circuit and receiver circuit for transmitting and receiving a differential signal pair. The driver circuit includes true and complement signal generating elements that generate a differential signal pair in tandem. Each of the true and complement signal generating elements includes a high-gain element and at least one low-gain element. The delay circuit is responsive to the true and complement data signal for iteratively controlling the high-gain element and low-gain element of each signal generating element to effect the generation of the differential signal pair, the delay circuit controlling the high-gain element with a delay relative to the low-gain element to thereby reduce ringing in the differential signal pair. The receiver circuit receives a differential receive signal pair, comprising true and complement receive signals having selected conditions over a pair of input lines and generates a true and complement data signal. The receiver circuit, during normal receiving operations, generates true and complement signals in response to the differential receive signal pair. During a test mode, the receiver circuit, in separate steps, compares the voltage levels of the true and complement receive signals to threshold voltages and generates an error signal if the selected true or complement receive signal does not have the proper relationship to the voltage level of the threshold voltage.

8 Claims, 3 Drawing Sheets

FIG. 2
RECEIVER CIRCUIT 100

DIFFERENTIAL DRIVER/RECEIVER CIRCUIT

FIELD OF THE INVENTION

The invention relates generally to the field of digital circuitry, and more generally to differential driver and receiver circuits.

BACKGROUND OF THE INVENTION

Digital electronic systems are generally fabricated from a number of integrated circuit chips that mount on printed circuit boards. The printed circuit boards carry traces that facilitate the transfer of signals representing digital information among the chips and other components on the boards. A digital system may comprise a number of boards mounted in one or more cabinets, and it is generally necessary to interconnect the boards to facilitate transfer of signals among the boards. Within a single cabinet, the wires in the form of backplanes or cables may be used to transfer signals among the broads, and between cabinets cables are typically used as transmission lines to transfer the signals.

In particular between cabinets, but also between boards and in some cases between chips on the same board, "differential" signaling is typically used. In differential signaling, two physical signals are transmitted together as a "differential pair" to facilitate the transfer of a single bit of information, with the logical state of the information bit being represented by the difference in voltage levels between the signals. If, for example, one signal of the differential pair is at a high voltage level and the other is at a low voltage level, the logical state of the information bit may be taken as asserted, or a "one." On the other hand, if the states of the signals are reversed, the logical state of the information bit may be taken as negated, or a "zero."

Differential signaling may be used for a number of reasons. Differential signaling may be used to reduce the likelihood that information transferred can be corrupted due to some types of noise, or undesirable voltage changes, which may be induced in the lines carrying the signals between the signal driver and the receiver. The lines which carry differential signal pairs are typically routed adjacent each other, and if noise is induced in one line it will likely also contemporaneously be induced in the other and with the same amplitude, resulting in what is generally known as "common-mode noise." Since the state of the information bit is represented by the difference between the voltage levels in the two lines, the noise voltage in the two lines will cancel.

In addition, differential signaling may be used when routing lines between components of a digital system that are powered by different power supplies, particularly if such components are in separate cabinets. In such systems, the voltages provided by the power supplies may be different, in which case the absolute voltage levels of the signals between the components may also be different. This is a particular difficulty in connection with components of a system that are housed in diverse cabinets. Since in differential signaling the state of the information bit is represented by the difference between voltage levels in the two lines carrying the differential signal pair, rather than by their absolute voltage levels, such offsets, which are termed "common-mode voltage shift," will be present in both lines of the differential signal pair and canceled when the voltage difference is determined.

The rate at which information bits can be transmitted in a digital system depends on a number of factors, with a primary factor being the rate at which transitions in a signal's voltage level can be made to occur on the line carrying the signal. However, a sharp transition can also cause a problem, in particular resulting in generation of noise, known as "ringing," at the beginning of a transition. That form of noise is one type of "differential noise," that is, noise that is individually generated and coupled over each line of the differential signal pair. In differential noise, the amplitude and timing of the noise are not necessarily the same on both lines and thus can not be corrected by taking the difference between voltage levels in the lines carrying a differential pair.

Another problem arises in some very large digital systems, particularly those with a large number of interconnection lines, namely, the maintenance of the lines among components to ensure that correct information is being transferred. In some large digital systems, the components may be connected by hundreds or even thousands of lines, and, if a line is faulty, incorrect information may be transferred. The problem may be exacerbated in a system that employs differential signaling, particularly if only one line of a differential signal pair is faulty. When that occurs, the information bit represented by the differential signal pair may generally be correctly received, with erroneous bits being received only intermittently. Thus, in such cases it may be difficult to determine even the fact that one line of the differential signal pair is faulty.

SUMMARY OF THE INVENTION

The invention provides a new and improved differential driver circuit and receiver circuit.

In brief summary, the new driver transmits a differential signal pair over a pair of controlled-impedance output lines in response to a true and complement data signal. The driver circuit comprises a differential mode signal generating circuit and a delay circuit. The differential mode signal generating circuit includes true and complement signal generating elements for generating a differential signal pair in tandem. Each of the true and complement signal generating elements includes a high-gain element and at least one low-gain element. The delay circuit is responsive to the true and complement data signal for iteratively controlling the high-gain element and low-gain element of each signal generating element to effect the generation of the differential signal pair, the delay circuit controlling the high-gain element with a delay relative to the low-gain element to thereby reduce ringing in the differential signal pair.

The receiver circuit receives a differential receive signal pair, comprising true and complement receive signals having selected conditions over a pair of input lines and generates a true and complement data signal. The receiver circuit comprises a differential receiver for generating a signal in response to the differential receive signal pair, and a signal utilization means, such as a latch, that performs a selected operation in response to the signals from the differential receiver. The differential receiver includes a threshold voltage generation means, a differential amplifier and a multiplexer. The threshold voltage generation means generates a threshold voltage. The differential amplifier has true and complement input terminals for receiving signals and generates an output signal at an output terminal having a voltage level representative of the difference between voltage levels of signals at the input terminals. The multiplexer means selectively couples the true and complement data signals to the differential amplifier during a receive mode and one of the true or complement receive signals and a threshold voltage to input terminals of the differential amplifier. Finally, the signal utilization means generates a digital output signal having selected values in response to the output signal from the differential receiver, the digital output signal having selected data conditions corresponding to the condition of the differential signal pair during the receive mode, and test conditions in response to the voltage levels of the output signals from the differential amplifiers during the test mode.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1A:
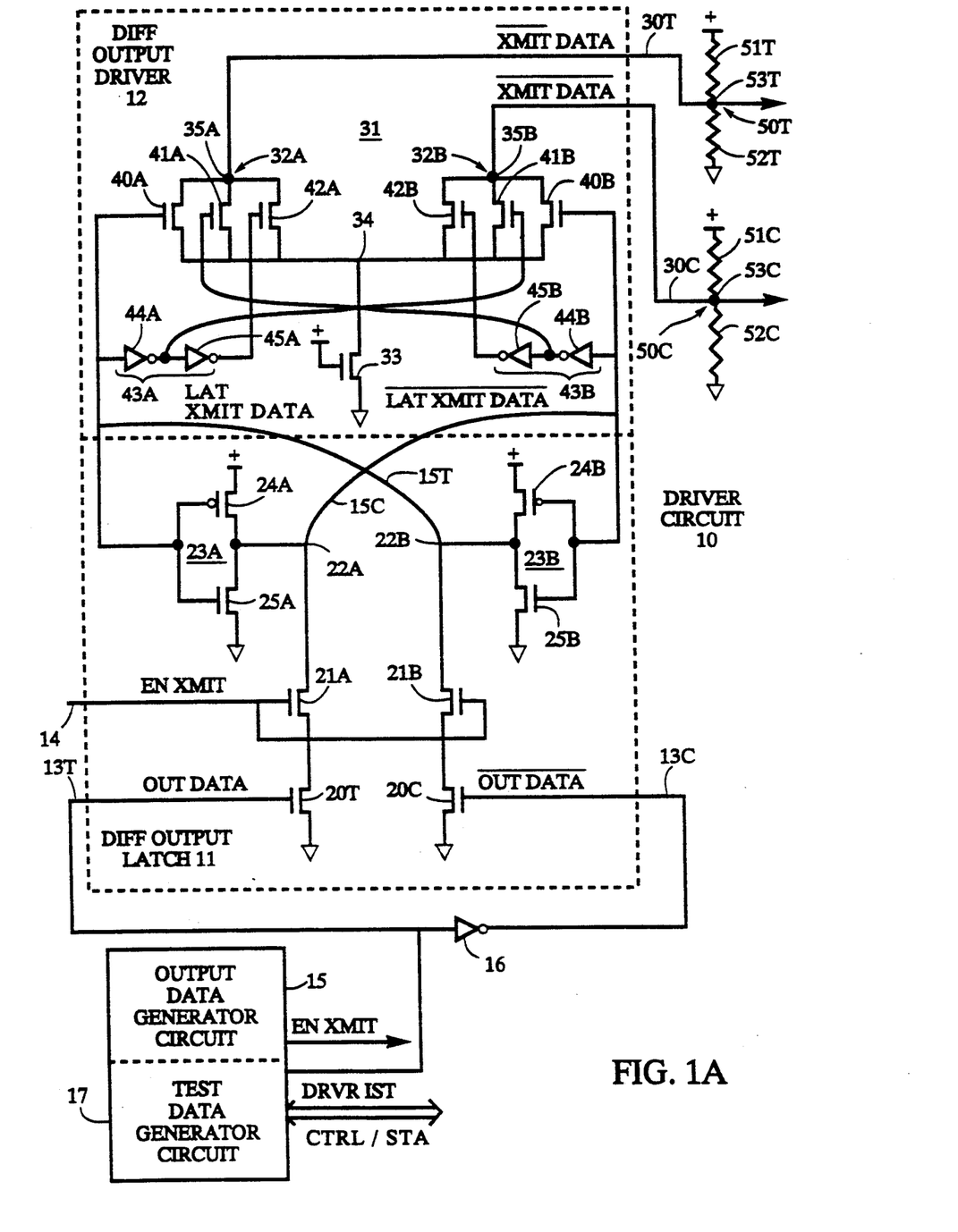
FIG. 1A is a detailed schematic diagram of a driver circuit constructed in accordance with the invention.
Figure 2:
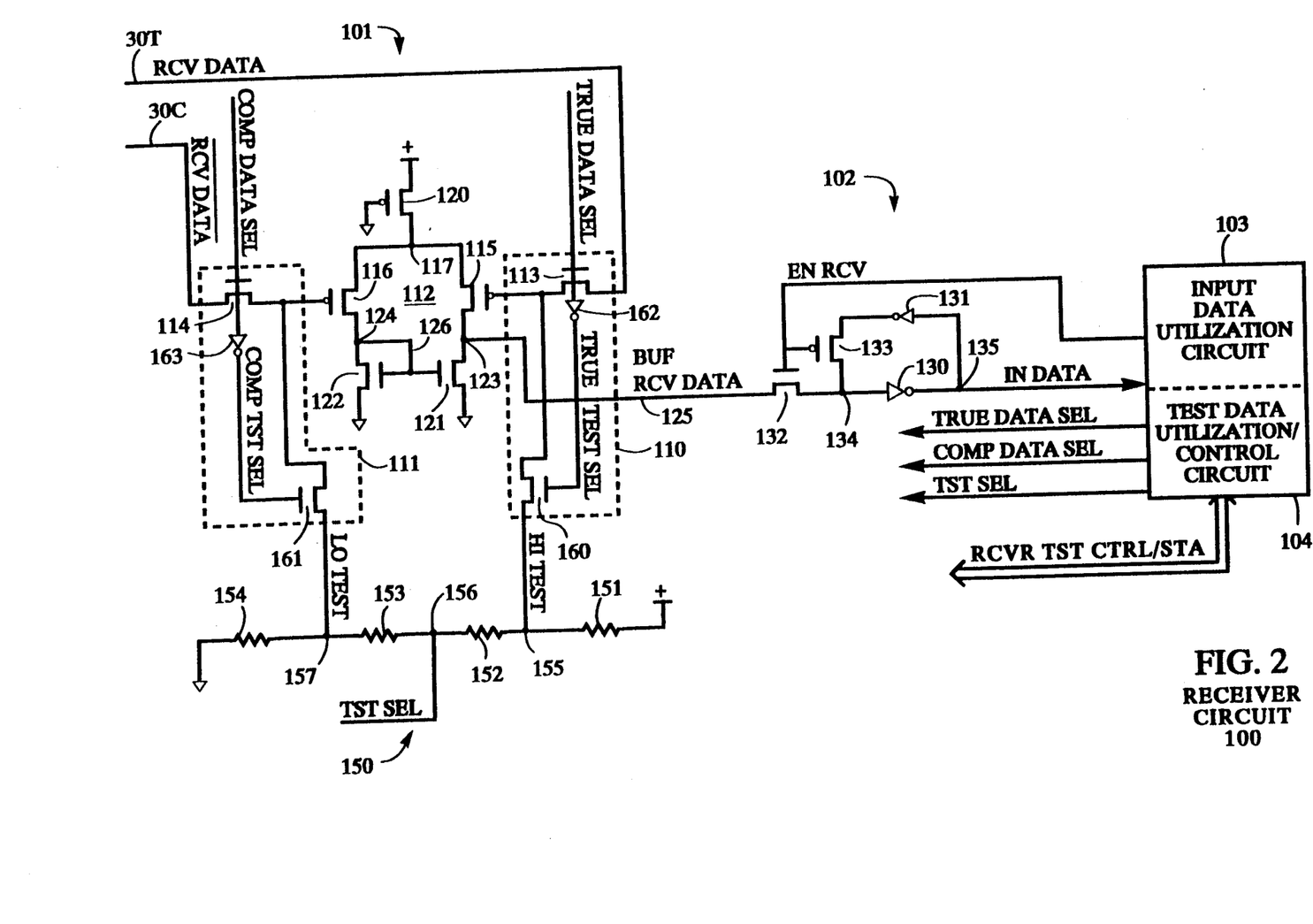
FIG. 2 is a detailed schematic diagram of a receiver circuit constructed in accordance with the invention.

FIGS. 1A and 2 are detailed logic diagrams of a driver circuit 10 and a receiver circuit 100, respectfully, constructed in accordance with the invention. The driver circuit 10 and receiver circuit 100 may, for example, be provided as interface circuits in connection with integrated circuit chips (not shown) in a digital system. In that role, the driver circuit 10 may be used to receive true and complement OUT DATA output data signal generated by other circuitry represented by output data generator circuit 15 and an inverter 16, latch it and transmit it in differential form over external lines to other circuitry, such as the receiver circuit 100. Similarly, the receiver circuit 100 may be used to receive a differential signal pair over external lines, latch it and provide the latched signal to other circuitry, represented by input data utilization circuit 103.

With reference to FIG. 1A, the driver circuit 10 includes two major elements, namely, a differential output latch 11 and a differential output driver 12. The differential output latch 11 receives the true and complement OUT DATA output data signals over lines 13T and 13C, respectively. As is conventional, the true signal is identified by the signal name, and the complement signal is identified by the signal name having a horizontal bar thereover.

In response to the assertion of an EN XMIT enable transmit signal, which is received from the output data generator circuit 15 by the differential output latch 11 over a line 14, the differential output latch 11 is conditioned by the true and complement OUT DATA signals and provides true and complement LAT XMIT DATA latched transmit data signals over lines 15T and 15C, respectively, to the differential output driver 12. The EN XMIT enable transmit signal provided by output data generator circuit 15 controls the timing of transmission by the differential output driver 12.

More particularly, the true OUT DATA signal on line 13T controls a transistor 20T and the complement OUT DATA signal on line 13C controls a transistor 20C. If the true OUT DATA signal is asserted, transistor 20T is on. In that case, the complement OUT DATA signal is negated and the transistor 20C controlled thereby will be off. The assertion of the EN XMIT signal will turn on both transistors 21A and 21B, which will create a current path from node 22A through transistors 21A and 20T to ground. Since transistor 20C is off due to the negation of the complement OUT DATA signal, no current path will be provided from a second node 22B therethrough to ground.

The grounding of node 22A results in the complement LAT XMIT DATA signal on line 15C being negated. The complement LAT XMIT DATA signal is coupled to an inverter 23B, which comprises a pull-up transistor 24B and a pull-down transistor 25B connected between a positive power source, indicated by "+", and ground. Both the source terminal of pull-up transistor 24B and the drain terminal of pull-down transistor 25B are connected to node 22B so that, when the complement LAT XMIT DATA signal is negated, the pull-up transistor 24B is turned on and the pull-down transistor 25B is turned off. When that occurs, a current path is created from the positive power supply through pull-up transistor 24B to node 22B. The off pull-down transistor 25B also blocks a current path therethrough from node 22B from ground, and so the power supply, through the on pull-up transistor 24B, energizes node 22B.

The energization of node 22B asserts the LAT XMIT DATA signal on line 15T. The asserted LAT XMIT DATA signal is coupled to an inverter 23A, which comprises a pull-up transistor 24A and a pull-down transistor 25A. Like inverter 23B, the transistors 24A and 24B are connected between the positive power source and ground, and the source terminal of pull-up transistor 24A and drain terminal of pull-down transistor 25A are both connected to node 22A. The asserted true LAT XMIT DATA signal on line 15T turns on pull-down transistor 25A and turns off pull-up transistor 25B, effectively providing another path (that is, a path in addition to the path through transistors 20T and 21A) from node 22A to ground.

At some point thereafter, the external circuitry (not shown) will negate the EN XMIT enable transmit signal. When that occurs, the transistors 21A and 21B are turned off, effectively isolating nodes 22A and 22B from transistors 20T and 20C. It will be appreciated that that will also effectively isolate node 22A from the path to ground through on transistor 20T. However, the true and complement LAT XMIT DATA latched transmit data signals remain in the same asserted and negated conditions, respectfully. This will be appreciated from the following. Even though the negation of the EN XMIT enable transmit signal turns transistor 21A off, thereby blocking the path to ground from node 22A through transistor 20T, a path to ground from node 22A remains through the on transistor 25A of inverter 23A. Accordingly, the complement LAT XMIT DATA signal will remain negated, maintaining pull-up transistor 24B in the on condition and pull-down transistor 25B in the off condition, and node 22B energized. Since node 22B is energized, the true LAT XMIT DATA signal is asserted, which maintains pull-up transistor 24A in the off condition and pull-down transistor in the on condition, which, in turn, maintains the coupling of node 22A to ground. Thus, the conditions of the true and complement LAT XMIT DATA latched transmit data signal are maintained after the EN XMIT enable transmit signal is negated.

While the operation of the differential output latch has been described in connection with true and complement OUT DATA signals having the asserted and negated conditions, respectively, it will be appreciated that complementary operations will occur if the conditions of the true and complement signals are reversed, that is, if they have the negated and asserted conditions respectively. In that case, if the true and complement OUT DATA signals are negated and asserted, the true and complement LAT XMIT DATA signals will have the negated and asserted conditions respectively. This will be apparent since the differential output latch 11 is constructed symmetrically with respect to the true and complement OUT DATA output data signals, and thus will operate symmetrically with respect to the conditions of the respective signals.

The true and complement LAT XMIT DATA latched transmit data signals are coupled to the differential output driver 12. The differential output driver 12 generates, in response to the true and complement LAT XMIT DATA signals, true and complement XMIT DATA signals which it transmits over output lines 30T and 30C, respectively. The true and complement XMIT DATA transmit data signals collectively define a single differential signal pair, in which the logic level, or digital information bit value, represented by the signal pair is defined by the difference in voltage level between the respective true and complement XMIT DATA signals. The differential output driver 12 generates the true and complement XMIT DATA signals so as to have short transition times, to facilitate high data transfer rates, while at the same time minimizing problems of signal ringing, resulting in fuzzing of the edges of the transitions, which can occur in response to too abrupt rates of changes in amplitude of the respective signals.

In one embodiment, in which the driver circuit 10 is on one componenet such as an integrated circuit chip, the differential output driver 12 generates and transmits true and complement XMIT DATA transmit data signals onto lines 30T and 30C for transmission to another component, which may reside, for example, on another integrated circuit chip. As is conventional in that embodiment, the lines 30T and 30C are connected to terminators 50T and 50C, respectively, which supply power to the lines. In particular, terminator 50T comprises a voltage divider including resistors 51T and 52T connected between a power supply and ground. The line 30T is connected to the node 53T between the two resistors 51T and 52T. Similarly, terminator 50C comprises a voltage divider including resistors 51C and 52C connected between the power supply and ground, and the line 30C is connected to the node 53C between the two resistors 51C and 52C.

The terminators 50T and 50C bias the lines 30T and 30C, respectively, to voltage levels that are determined by the voltage levels of the respective power supplies and the ratios of the resistances of the respective resistors. Generally, the differential output driver 12 will be continually coupling current to ground from the lines 30T and 30C, regardless of whether the respective signals are in their asserted or negated states. The relative voltage levels of the respective true and complement XMIT DATA signals, which, in turn, determines the asserted or negated states of the respective true and complement XMIT DATA signals, will be determined by the relative amounts of current coupled by the differential output driver 12 from the respective lines 30T and 30C.

The differential output driver circuit 12 includes a current mode logic circuit 31, which comprises two current steering elements 32A and 32B and a transistor 33 all connected to a node 34. Transistor 33 has a gate terminal connected to a power supply, which controls the transistor 33 to operate as a current source for the current steering elements 32A and 32B; that is, the gate terminal is controlled to permit transistor 33 to couple a predetermined maximum amount of current therethrough from both current steering elements 32A and 32B. In addition, the true and complement LAT XMIT DATA signals, the voltage levels of the signals on lines 30T and 30C and the voltage level of node 34, all condition current steering elements 32A and 32B to selectively couple more or less current, as determined by the conditions of the true and complement LAT XMIT DATA signals, to node 34 from the lines 30T and 30C.

Each terminator 50T and 50C applies a voltage to lines 30T and 30C and maintains it at a particular value determined by the relative conductance of the current steering elements 32A and 32B, respectively, to generate the true and complement XMIT DATA transmit data signals. The line 30T is connected to a node 35A of one current steering element 32A, and line 30C is connected to a node 35B of the other current steering element 32B. That is, if the true LAT XMIT DATA signal is asserted and the complement is negated, the current steering element 32A will couple more current to node 34 and the current steering element 32B will couple less current thereto, with transistor 33 ensuring that the sum of the currents coupled by both current steering elements remains at approximately the same predetermined level. When that occurs, more current will be coupled through the resistor 51T of terminator 50T than through resistor 51C of terminator 50C, and so the voltage drop across resistor 51T will be greater than across resistor 51C. Accordingly, the voltage level at node 53T and on line 30T, which carries the true XMIT DATA signal, will be lower than the voltage level at node 53C and on line 30C, which carries the complement XMIT DATA signal. In that case, the difference between the voltages on lines 30T and 30C is negative, which provides a differential XMIT DATA signal pair which is deemed to have a negated logic level.

On the other hand, if the true LAT XMIT DATA signal is negated and the complement is asserted, the current steering element 32A will couple less current to node 34 and the current steering element 32B will couple more current thereto, with transistor 33 ensuring that the sum of the currents coupled by both current steering elements remains at approximately the same predetermined level. When that occurs, less current will being coupled through the resistor 51T of terminator 50T than through resistor 51C of terminator 50C, and so the voltage drop across resistor 51T will be less than across resistor 51C. Accordingly, the voltage level at node 53T and thus on line 30T, which carries the true XMIT DATA signal, will be greater than that at node 53C and on line 30C, which carries the complement XMIT DATA signal. In that case, the difference between the voltages on lines 30T and 30C is positive, which provides a differential XMIT DATA signal pair which is deemed to have a negated logic level, in the negative-assertion logic convention.

The true and complement LAT XMIT DATA signals provided by the differential output latch 11 control the relative conductance of the current steering elements 32A and 32B and thus the amount of current each will couple from the respective lines 30T and 30C. If the LAT XMIT DATA signals enable the conductance of the current steering element 32B to be greater than that of the current steering element 32A, the voltage level of the complement XMIT DATA signal will be lower than that of the true XMIT DATA signal. In that case, the differential XMIT DATA signal pair will have an asserted logic level. On the other hand, if the conductance of the current steering element 32B is less than that of the current steering element 32A, the voltage level on line 30T, and thus of the true XMIT DATA signal, will be lower than that of the complement XMIT DATA signal. In that case, the differential XMIT DATA signal pair, which defined by the difference in voltage level between the true and complement XMIT DATA signals, will have a negated logic level.

Each current steering element 32A and 32B includes a set of transistors 40A through 42A and 40B through 42B, respectively. The transistors 40A through 42A and 40B through 42B, in combination with tapped delay lines 43A and 43B, control the generation and shaping of the true and complement XMIT DATA transmit data signals in response to the true and complement LAT XMIT DATA latched transmit data signals. In current steering element 32A, transistor 41A has a relatively large gain, that is, change in conductance as a function of the signal applied to its gate terminal, whereas the other transistors 40A and 42A each have relatively small gains. Similarly, in current steering element 32B, transistor 41B has a relatively large gain, whereas transistors 40B and 42B each have relatively small gains. The delay lines 43A and 43B effectively control the transistors 40A through 42A and 40B through 42B to facilitate the assertion, negation and shaping of the transitions of the true and complement XMIT DATA transmit data signals.

Each delay line 43A and 43B includes series-connected inverters 44A and 45A, comprising delay line 43A, and inverters 44B and 45B, comprising delay line 43B. The true LAT XMIT DATA signal from differential output latch 11 is coupled to the input terminal of inverter 44A and the gate terminal of transistor 40A. The output terminal of inverter 44A is connected to the input terminal of inverter 45A and is also connected to the gate terminal of transistor 41B of current steering element 32B. The output terminal of inverter 45A is connected to the gate terminal of the transistor 42A of current steering element 32A. Similarly, the complement LAT XMIT DATA signal from differential output latch 11 is coupled to the input terminal of inverter 44B and the gate terminal of transistor 40B. The output terminal of inverter 44B is connected to the input terminal of inverter 45B and is also connected to the gate terminal of transistor 41A of current steering element 32A. The output terminal of inverter 45B is connected to the gate terminal of the transistor 42B of current steering element 32B.

Figure 1B:
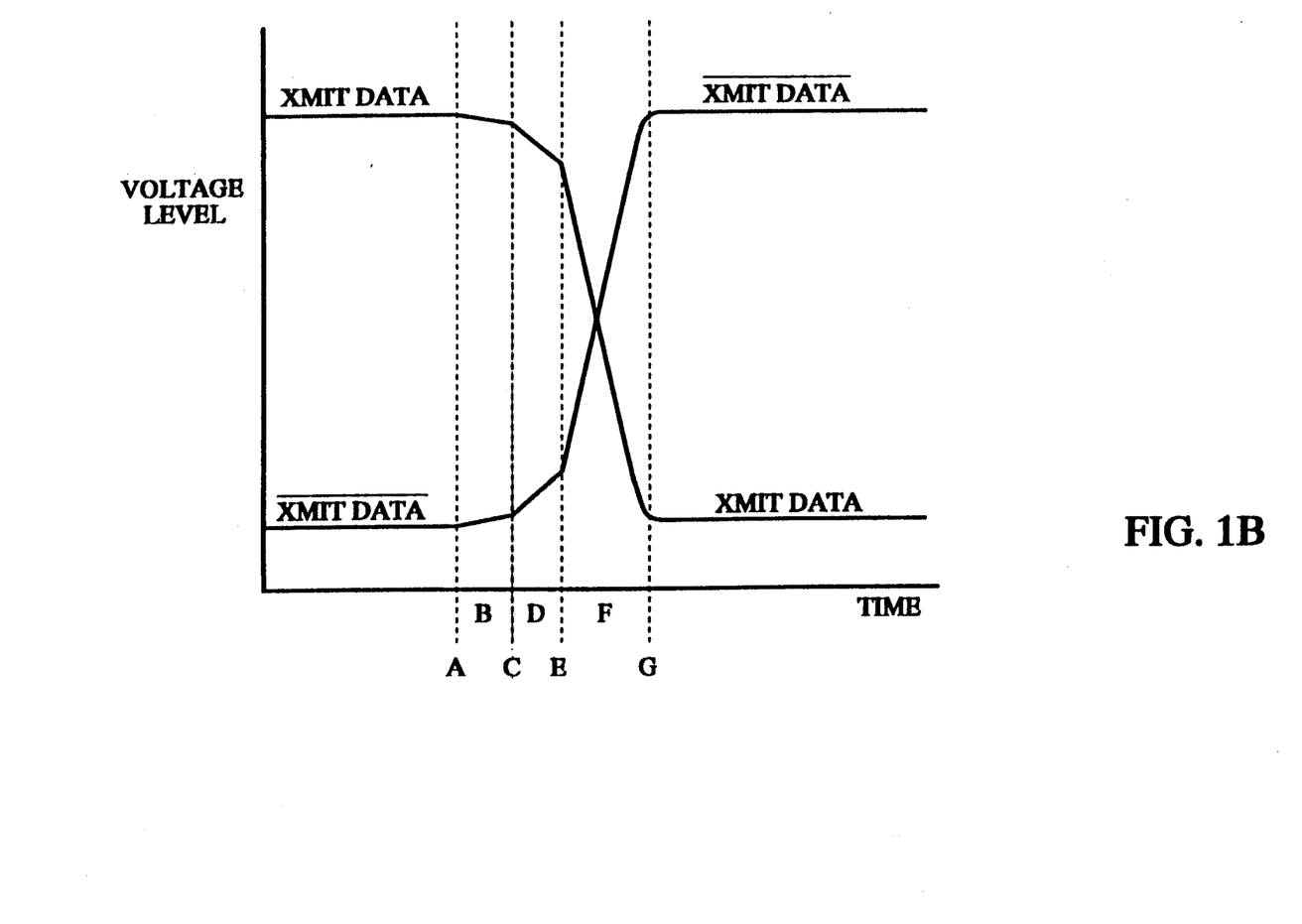
FIG. 1B is a graph useful in understanding the operation of the driver circuit depicted in FIG. 1A.

The operation of the differential output driver 12, in particular the current steering elements 32A and 32B, will be described in connection with FIGS. 1A and 1B. FIG. 1B depicts the voltage levels of the true and complement XMIT DATA signals through one differential signal transition, in which the true XMIT DATA signal goes from a high voltage level to a low voltage level and the complement XMIT DATA signals goes from a low voltage level to a high voltage level, thereby negating the differential XMIT DATA signal pair.

In the example shown in FIG. 1B, at time A (FIG. 1B) the differential output latch 11 asserts the true LAT XMIT DATA and negates the complement LAT XMIT DATA signal. In response, the asserted true LAT XMIT DATA signal will begin increasing the conductance of the transistor 40A in current steering element 32A. Contemporaneously, the negated complement LAT XMIT DATA signal will reduce the conductance of the transistor 40B in current steering element 32B. When that occurs, the current steering element 32B begins reducing the amount of current which it couples therethrough from line 30C, and current steering element 32A begins increasing the amount of current which it couples therethrough from line 30T. As a result the voltage level of true XMIT DATA signal on line 30T begins decreasing, and that of the complement XMIT DATA signal on line 30C begins increasing, as shown on FIG. 1B. The voltage level decrease of the true XMIT DATA signal and increase of the complement XMIT DATA signal will continue during time period "B" shown on FIG. 1B.

At some time "C" at the end of the time period "B," as determined by the propagation delay through inverter 44B, the inverter 44B will begin increasing the conductance of transistor 41A. Contemporaneously, the inverter 44A will begin decreasing the conductance of transistor 41B. The time period "B" from time A to time C will depend on the propagation delays of the respective signals through inverters 44A and 44B. As noted above, transistors 41A and 41B have relatively high gains, and so the conductance of transistors 41A and 41B will be increased and decreased, respectively, very quickly. As a result, the current steering element 32A will rapidly begin coupling relatively large amounts of current therethrough to node 34.

The rapid increase of current through current steering element 32A will result in a large and rapid voltage drop across resistor 51T, thereby rapidly decreasing the voltage level of node 53T and thus of line 30T. Contemporaneously, since transistor 33 maintains the sum of the currents through the current steering elements 32A and 32B at a predetermined maximum level, in combination with the signal from inverter 44A, transistor 41B will be rapidly turned off, and so the rate at which the current flows through current steering element 32B will be rapidly reduced. As a result, the voltage drop across resistor 51C will be rapidly reduced, rapidly increasing the voltage level of node 53C and thus of line 30T. This is indicated in FIG. 1B by the increasing magnitude of the slopes of the graphs of the respective signals in time period "D" following time "C," compared to those in time period "B."

At time E, the inverter 45A begins to increase the conductance of transistor 42A in current steering element 32A. Contemporaneously, inverter 45B of delay line 43B begins to reduce the conductance of transistor 42B in current steering element 32B. The increasing conductance of transistor 42A, combined with the continuing increase of the conductance of transistor 41A due to the signal from inverter 44B, increases the rate at which current flows through current steering element 32A, further increasing the rate of the decline of the voltage level of line 30T. Similarly, the decreasing conductance of transistor 42B, combined with the continuing decrease of the conductance of transistor 41B due to the signal from inverter 44A, decreases the rate at which current flows through current steering element 32B, further increasing the rate of the increase in voltage level of line 30C. These are reflected in the increase in magnitude of the slopes of the respective true and complement XMIT DATA signals immediately after time E in time period F. At some point, as represented by time G, the transistors 40A through 42A and 40B through 42B in current steering elements 32A and 32B, respectively, reach their maximal and minimal conductance levels, at which point the voltage levels of the respective signals stop changing.

It will be appreciated that, since the current steering elements 32A and 32B are symmetric with respect to the true and complement LAT XMIT DATA latched transmit data signals, they will operate in a complementary manner if the condition of the true and complement LAT XMIT DATA signals are complementary, which, in turn, enables the differential output latch 11 to generate the signals with the complementary conditions.

The low-gain transistors, that is, low-gain transistors 40A and 42A in current steering element 32A, and transistors 40B and 42B in current steering element 32B, are provided to smooth what would, in their absence, be an abrupt and rapid change in the voltage levels of the respective signals, which could result in ringing at the beginning of the signal transitions. It will be appreciated that the low-gain transistors are provided to modify the rate of change of the voltage levels of the respective signals at the beginning of a transition from that which would be provided by high-gain transistors 41A and 41B alone, to reduce ringing that might otherwise be present. In some particular embodiments, that can be accomplished by providing only the low-gain transistors 40A and 40B, which are enabled prior to the enablement of the high-gain transistors 41A and 41B.

Each delay line 43A and 43B in the differential output driver 12 has been described as comprising a series of inverters, each of which complements the signal it receives. In that case, the output signal from inverter 44A, which is the complement of the true LAT XMIT DATA latched transmit data signal from the differential output latch 11 (as delayed by the propagation delay of the inverter 44A) will be used to control transistor 41B of current steering element 32B. Similarly, the output signal from inverter 44B, which is the complement of the complement LAT XMIT DATA signal (as delayed by the propagation delay of the inverter 44B) will be used to control transistor 41A of current steering element 32A. It will be appreciated that the delay lines may be formed of non-inverting components, in which case the output signal from the first component of delay lines 43A and 43B will control the transistors 41A and 41B, respectively, of the current steering elements 32A and 32B. However, having both delay lines 43A and 43B control both current steering elements 32A and 32B can assist in ensuring that complementary operations contemporaneously occur in the current steering elements 32A and 32B.

The true and complement XMIT DATA signals on lines 30T and 30C, are received as true and complement RCV DATA receive data signals by a receiver circuit elsewhere in the digital system, such as receiver circuit 100 shown in FIG. 2. Since the true and complement RCV DATA signal collectively define a single, negative assertion, differential RCV DATA signal pair (in conformity with the signals provided by driver circuit 10 as described above), the differential signal pair is deemed asserted if the voltage level of the true RCV DATA signal is above that of the complement RCV DATA signal. On the other hand, the differential signal pair is deemed negated if the voltage level of the complement RCV DATA signal is above that of the true RCV DATA signal.

With reference to FIG. 2, the receiver circuit 100 includes a differential receiver 101 and a differential input latch 102. The differential receiver 101 receives the differential RCV DATA receive data signal pair and generates a BUFF RCV DATA buffered receive data signal whose condition is determined by the condition of the differential RCV DATA signal pair. That is, the differential receiver 101 receives the true and complement RCV DATA signals and generates a BUFF RCV DATA buffered receive data signal having a low voltage level if the differential RCV DATA signal pair is asserted, and a BUFF RCV DATA signal having a high voltage level if the differential RCV DATA signal pair is negated.

The differential input latch 102 receives the BUF RCV DATA signal from the differential receiver 101 as well as an EN RCV enable receive timing signal. In response to the assertion of the EN RCV signal, the differential input latch 102 latches the BUF RCV DATA signal and provides a complement IN DATA signal to other circuitry, represented by the input data utilization circuit 103. The EN RCV enable receive signal may also be provided by the input data utilization circuit 103 to controls the timing of reception by the differential input latch 102.

During normal operation of the differential receiver 101, a TRUE DATA SEL true data select signal and a COMP DATA SEL complement data select signal are both asserted. The TRUE DATA SEL and COMP DATA SEL signals are controlled by a test data utilization and control circuit 104, whose function will be described below. The asserted TRUE DATA SEL and COMP DATA SEL signals condition multiplexers 110 and 111 to couple the true and complement RCV DATA signals, respectively, to a differential amplifier circuit 112. More specifically, the asserted TRUE DATA SEL and COMP DATA SEL signals enable pass transistors 113 and 114, respectively, in multiplexers 110 and 111 to couple the true and complement RCV DATA signals, respectively, to the differential amplifier circuit 112.

The differential amplifier circuit 112 receives the true RCV DATA signal, through on pass transistor 113 at the gate terminal of a transistor 115, and the complement RCV DATA signal, through on pass transistor 114, at the gate terminal of a transistor 116. The drain terminals of both transistors 115 and 116 are connected to a node 117, which, in turn, is connected to the source terminal of a current source comprising a load transistor 120. The drain terminal of transistor 120 is, in turn, connected to a power supply, as indicated by "+" indicator. The gate terminal of load transistor 120 is connected to ground, which biases the transistor 120 in the on condition, and enables it to provide a predetermined maximum amount of current to node 117.

As the differential RCV DATA signal pair shifts from an asserted condition to a negated condition, the voltage level of the true RCV DATA signal decreases and the voltage level of the complement RCV DATA signal increases. The decrease of the voltage level of the true RCV DATA signal biases the transistor 115 of differential amplifier 112 more on. In that condition, the conductance of transistor 115 increases, which effectively increases the amount of current conducted therethrough and enables the voltage level of a node 123 to rise. Node 123 represents the connection point of the source terminal of transistor 115, the drain terminal of a transistor 121, and the line 125 carrying the BUF RCV DATA buffered receive data signal.

On the other hand, the increase of the voltage level of the complement RCV DATA signal biases transistor 116 more off, which decreases the conductance of the transistor 116, effectively decreasing the amount of current conducted therethrough and reducing the voltage level of a node 124. Node 124 represents the connection between the source terminal of transistor 116, the drain terminal of a transistor 122 and a line 126 which controls the gate terminals of transistors 121 and 122.

The decrease of the voltage level at node 124 is reflected by the signal on line 126 turning the transistor 121 more off. This, in turn, effectively decreases the conductances of transistors 122 and 121. The decrease of the conductance of transistor 121, coupled with the increase of the conductance of transistor 115 as described above, enhances the voltage level increase of node 123, which, in turn, increases the voltage swing of the BUF RCV DATA signal. It will be appreciated that the decrease of the voltage level at node 124 will also turn transistor 122 more off at this point, and so it will be desirable to condition transistors 116 and 122 to ensure that the change of the complement RCV DATA signal causes the conductance of transistor 116 to decrease at least as fast as the change of the voltage level at node 124 causes the conductance of transistor 122 to decrease.

On the other hand, if the differential RCV DATA signal pair shifts from a negated condition to an asserted condition, the voltage level of the true RCV DATA signal increases and the voltage level of the complement RCV DATA signal decreases. The increase of the voltage level of the true RCV DATA signal biases the transistor 115 of differential amplifier 112 more off. In that condition, the conductance of transistor 115 decreases, which effectively decreases the amount of current conducted therethrough and reduces the voltage level of node 123. On the other hand, the decrease of the voltage level of the complement RCV DATA signal biases transistor 116 more on, which increases the conductance of the transistor 116, effectively increasing the amount of current conducted therethrough and increasing the voltage level of node 124.

The increase of the voltage level at node 124 is reflected by the signal on line 126 turning the transistor 121 more on. This, in turn, effectively increases the conductance of transistors 122 and 121. The increase of the conductance of transistor 121, coupled with the decrease of the conductance of transistor 115 as described above, enhances the voltage level decrease of node 123, which, in turn, enhances the voltage reduction of the BUF RCV DATA signal.

The BUF RCV DATA signal is coupled over line 125 to the differential input latch 102. The differential input latch includes two inverters, 130 and 131, and two transistors 132 and 133. When the input data utilization circuit 103 asserts the EN RCV enable receive signal, pass transistor 132 is turned on to couple the signal on line 125 to a node 134. The assertion of the EN RCV signal also turns off transistor 133, which isolates node 134 from the output terminal of inverter 131. As a result, the signal at node 134 reflects only the signals coupled thereto by transistor 132 from line 125. The input terminal of inverter 130 is also connected to node 134. As a result, the inverter 130 provides, at its output terminal connected to node 135, a signal, which comprises the IN DATA input data signal, which is the complement of the signal at node 134. Accordingly, when the BUF RCV DATA buffered receive data signal has a low voltage level, which occurs when the differential RCV DATA receive data signal is asserted, node 135 and the IN DATA signal are at a high voltage level when the EN RCV enable receive signal is asserted. Conversely, when the BUF RCV DATA buffered receive data signal is at a high voltage level, which occurs when the differential RCV DATA signal is negated, node 135 and the IN DATA signal are at a low voltage level when the EN RCV signal is asserted.

Node 135 is also connected to the input terminal of inverter 131. The output terminal of inverter 131 is connected to one terminal of transistor 133. When the EN RCV enable receive signal is negated, the transistor 133 is turned on to couple the output signal from inverter 131 to the node 134, and hence to the input terminal of inverter 130. However, negation of the EN RCV signal also turns off pass transistor 132, isolating the node 134 from the BUF RCV DATA signal. It will be appreciated that, since the inverter 131 complements the signal at node 135, which, in turn, is the complement of the signal that was present at node 134 when the EN RCV signal was asserted, the same signal will be provided at node 134 by inverter 131 when the EN RCV signal is negated. Accordingly, the IN DATA signal will remain in the same asserted or negated condition when the EN RCV signal is negated.

In accordance with another aspect of the invention, the differential driver circuit 10 and receiver circuit 100 also include elements which facilitate the location of faulty signal paths therebetween. A faulty signal path may constitute, for example, a break in a wire 30T or 30C between driver 10 and receiver 100. Generally, if such a defect exists in connection with the line for either the true or complement signal of a differential pair, the voltage level of the signal as received by the receiver circuit 100 will follow the voltage level of the other signal, and the identification of the particular line which is defective is difficult.

To accommodate identification and location of such defects, the driver circuit 10 (FIG. 1A) is connected to a test data generator circuit 17 and receiver circuit 100 is connected to a test data utilization/control circuit 104. The test data generator circuit 17, in response to DRVR TST CTRL driver test control signals from external control circuitry (not shown), generates an OUT DATA output data signal having a selected condition and controls the EN XMIT enable transmit signal to generate and transmit a differential XMIT DATA signal pair corresponding thereto.

Similarly, the test data utilization/control circuit 104 receives RCVR TST CTRL receiver test control signals from the external control circuitry, which enable it to condition the differential receiver 101 as described below, to facilitate the test operation. Briefly, in enabling the test operation, the test utilization/control circuit 104 separately enables the coupling of the true and complement RCV DATA signals to the differential amplifier 112 along with a test signal of a selected voltage and determines the condition of the IN DATA signal in response thereto. The test data utilization/control circuit 104 provides RCVR TST STA receiver test status signals which indicate the condition of the IN DATA input data signal, and the external circuitry can compare the actual condition of the IN DATA input data signal with the condition expected in response to the true or complement XMIT DATA signal and determine whether the condition is correct. The coupling of the test signal voltage effectively substitutes for the one of the true or complement RCV DATA signal that is not being coupled to the differential amplifier at a particular time, thereby facilitating separate testing of the true and complement RCV DATA signals.

More specifically, to accommodate the test operation, the multiplexers 110 and 111 in differential receiver 101 are connected to a threshold voltage reference generator network 150, comprising a resistor network that generates HI TEST and LO TEST signals having voltage levels selectable by a TST SEL test select signal from test data utilization and control circuit 104. The test data utilization and control circuit 104 separately conditions the TRUE DATA SEL true data select and COMP DATA SEL complement data select signals to couple either the HI TEST and complement RCV DATA signal, on the one hand, or the LO TEST and true RCV DATA signals on the other hand, to the differential amplifier 112. The test data utilization and control circuit 104 also conditions the TST SEL test select signal to control the voltage levels of the HI TEST and LO TEST signals to selected threshold voltage levels.

When test data utilization and control circuit 104 negates the TRUE DATA SEL true data select signal, the transistor 113 in multiplexer 110 is turned off. When that occurs, an inverter 162 complements the negated TRUE DATA SEL signal to assert a TRUE TST SEL true test select signal that, in turn, enables a transistor 160 to couple the HI TEST signal to the gate terminal of transistor 115. In addition, when the COMP DATA SEL complement data select signal is negated, the transistor 114 in multiplexer 111 is turned off. When that occurs, an inverter 163 complements the negated COMP DATA SEL signal to assert a COMP TST SEL complement test select signal that enables a transistor 161 to couple the LO TEST signal to the gate terminal of transistor 116.

The threshold voltage reference generator network 150 comprises resistors 151 through 154 connected in series between a power supply and ground. The connection between resistors 151 and 152 comprises a node 155, from which point the HI TEST signal is taken. The connection between resistors 152 and 153 comprises a node 156, at which point the TST SEL true test select signal is applied. Finally, the connection between resistors 153 and 154 comprises a node 157, from which point the LO TEST signal is taken.

The TST SEL test select signal governs the voltage conditions of the HI TEST and LO TEST signals. In particular, when test data utilization and control circuit 104 is asserting the TST SEL signal, a high voltage is applied to node 156. In that condition, the HI TEST signal is at the high voltage level, and the LO TEST signal is at a threshold voltage level between that high level provided by the power supply and the ground voltage level, the voltage level being determined by the relative resistances of resistors 153 and 154 and the voltage difference between the power supply level applied to resistor 151 and ground. The relative resistance of resistors 153 and 154 is selected so that the voltage level of the LO TEST signal is at a threshold level for the detection of transitions of the differential RCV DATA signal pair, as will be described below.

On the other hand, when the TST SEL test select signal is negated, a low voltage is applied to node 156. In that condition, the LO TEST signal is at a ground voltage level, and the HI TEST signal is at a threshold voltage level between that provided by the power supply and the ground voltage level. As with resistors 153 and 154, the relative resistance of resistors 151 and 154 is selected so that the voltage level of the LO TEST signal is at a threshold level for the detection of transitions of the differential RCV DATA signal pair.

It will be appreciated that, if the LO TEST and HI TEST signals are to have the same threshold voltage level, only one pair of resistors is required connected in series between the power supply and ground. In that case, the LO TEST and HI TEST signals can both be obtained from the node between the series-connected resistors. The TST SEL test select signal is also not needed in that configuration.

To verify the correct operation of the line 30T, the test data utilization and control circuit 104 asserts the TRUE DATA SEL true data select signal and negates the COMP DATA SEL complement data select signal. The assertion of the TRUE DATA SEL signal turns pass transistor 113 on, to, in turn, couple the true RCV DATA signal to the differential amplifier 112. Since the TRUE DATA SEL signal is asserted, inverter 162 negates the TRUE TST SEL true test select signal to turn pass transistor 160 off, so that the HI TEST signal does not control the transistor 115. On the other hand, the negation of the COMP DATA SEL signal turns off pass transistor 114. The negated COMP DATA SEL signal enables the inverter 163 to assert the COMP TST SEL complement test select signal and turn pass transistor 161 on to couple the LO TEST signal to the gate terminal of transistor 116.

In this condition, the differential amplifier 112 will generate a BUF RCV DATA buffered receive data signal whose voltage level is a function only of the difference in voltage levels of the true RCV DATA signal and the LO TEST signal. If the TST SEL test select signal is asserted, the voltage level of the LO TEST signal will be at the threshold voltage level. To test proper reception of the true RCV DATA signal when it is at a high voltage level, the DRVR TST CTRL driver test control signals enables the test data generator circuit 17 (FIG. 1A) to generate true and complement OUT DATA output data signals to enable drive circuit 10 to, in turn, provide a true XMIT DATA transmit data signal at a high voltage level. If line 30T is operating properly, the signal is received as a RCV DATA receive data signal by receiver circuit 100. That signal, along with the LO TEST signal at the threshold voltage level, enable the differential amplifier 112 to generate a BUF RCV DATA buffered received data signal at a low voltage level. In that condition, the differential input latch 102 will generate an asserted IN DATA input data signal, that is, an IN DATA signal at a high voltage level. The test data utilization and control circuit 104 receives the IN DATA signal and couples it in the RCVR TST STA receiver test status signals to external circuitry (not shown).

On the other hand, to test proper reception of the true RCV DATA signal when it is at a low voltage level, the DRVR TST CTRL driver test control signals enable the test data generator circuit 17 to generate true and complement OUT DATA output data signals to enable driver circuit 10 to provide a true XMIT DATA transmit data signal at a low voltage level. In addition, the test data utilization and control circuit 104 maintains the TST SEL signal asserted, the TRUE DATA SEL true data select signal asserted and the COMP DATA SEL complement data select signal negated. The asserted TST SEL signal maintains the LO TEST low test signal at the threshold voltage level, the asserted TRUE DATA SEL true data select signal enables the multiplexer 110 to couple the true RCV DATA signal to differential amplifier 112, and the negated COMP DATA SEL signal enables the multiplexer 111 to couple the LO TEST signal to the differential amplifier. If line 30T is properly coupling the true RCV DATA signal to the receiver circuit 100 the differential amplifier 112 will generate a BUF RCV DATA buffered received data signal at a high voltage level. In that condition, the differential input latch 102 will generate a negated IN DATA input data signal, that is, an IN DATA signal at a low voltage level, which the test data utilization and control circuit 104 receives and couples to the external circuitry as the RCVR TST CTRL receiver test control signals.

The test data generator circuit 17 and test data utilization and control circuit 104 can initiate complementary operations to test the proper operation of line 30C. In particular, to verify the correct operation of the line 30C, the test data utilization and control circuit 104 negates the TRUE DATA SEL true data select signal and asserts the COMP DATA SEL complement data select signal. The assertion of the COMP DATA SEL signal turns pass transistor 114 on, to, in turn, couple the complement RCV DATA signal to the differential amplifier 112. Since the COMP DATA SEL signal is asserted, inverter 163 negates the TRUE TST SEL true test select signal to turn pass transistor 161 off, so that the LO TEST signal does not control the transistor 116. On the other hand, the negation of the TRUE DATA SEL signal turns off pass transistor 113. The negated TRUE DATA SEL signal enables the inverter 162 to assert the TRUE TST SEL true test select signal and turn pass transistor 160 on to couple the HI TEST signal to the gate terminal of transistor 115.

In this condition, the differential amplifier 112 will generate a BUF RCV DATA buffered receive data signal whose voltage level is a function only of the difference in voltage levels of the complement RCV DATA signal and the HI TEST signal. If the TST SEL test select signal is negated, the voltage level of the HI TEST signal will be at the threshold voltage level. To test proper reception of the complement RCV DATA signal when it is a high voltage level, the DRVR TST CTRL driver test control signals enable the test data generator circuit 17 (FIG. 1A) to generate true and complement OUT DATA output data signals to enable driver circuit 10 to, in turn, provide a complement XMIT DATA transmit data signal at a high voltage level. If line 30C is operating properly, the signal is received as a complement RCV DATA receive data signal by receiver circuit 100. That signal, along with the HI TEST signal at the threshold voltage level enable the differential amplifier 112 to generate a BUF RCV DATA buffered received data signal at a high voltage level. In that condition, the differential input latch 102 will generate a negated IN DATA input data signal, that is, an IN DATA signal at a low voltage level. The test data utilization and control circuit 104 receives the IN DATA signal and couples it in the RCVR TST STA receiver test status signals to external circuitry (not shown).

On the other hand, to test proper reception of the complement RCV DATA signal when it is at a low voltage level, the DRVR TST CTRL driver test control signals enable the test data generator circuit 17 to generate true and complement OUT DATA output data signals to enable driver circuit 10 to provide a complement XMIT DATA transmit data signal at a low voltage level. In addition, the test data utilization and control circuit 104 maintains the TST SEL signal negated, the TRUE DATA SEL true data select signal negated and the COMP DATA SEL complement data select signal asserted. The negated TST SEL signal maintains the HI TEST low test signal at the threshold voltage level, the negated TRUE DATA SEL true data select signal enables the multiplexer 110 to couple the HI TEST signal to differential amplifier 112, and the asserted COMP DATA SEL signal enables the multiplexer 111 to couple the RCV DATA signal to the differential amplifier. If line 30C is properly coupling the complement RCV DATA signal to the receiver circuit 100, the differential amplifier 112 will generate a BUF RCV DATA buffered received data signal at a low voltage level. In that condition, the differential input latch 102 will generate an asserted IN DATA input data signal, that is, an IN DATA signal at a high voltage level, which the test data utilization and control circuit 104 receives and couples to the external circuitry in the RCVR TST CTRL receiver test control signals.

In either case, the external circuitry which controls both the test data generator circuit 17 and the test data utilization and control circuit 104 can receive the RCVR TST CTRL receiver test control signals, representing the state of the IN DATA input data signal, and compare it to the state that it would expect in response to the particular condition of the true or complement XMIT DATA signals as controlled by the test data generator circuit 17. If the external circuitry determines that the RCVR TST CTRL signals are not as expected, it can determine therefrom that the particular line 30T or 30C, or both, is defective.

It will be appreciated that the test data generator circuit 17 and test data utilization and control circuit 104 may also be useful in detecting certain defects in the operation of the differential output driver 12, if it is unable to generate true and complement XMIT DATA signals of appropriate voltage levels.

The multiplexers 110 and 111, along with resistor network 150, may also be useful in holding the receiver 100 to a known state if either of the lines 30T or 30C have been determined to be faulty. In that operation, the TST SEL test select signal is conditioned to a predetermined level to control both the voltage levels of both the HI TEST high test signal and the LO TEST low test signal. In addition, the TRUE DATA SEL true data select signal and COMP DATA SEL complement data select signal are both negated, which enable the respective multiplexers 110 and 111 to couple the HI TEST and LO TEST signals, respectively, to the transistors 115 and 116 of the differential amplifier 112. Since the differential amplifier 112 is controlled by signals of fixed and predetermined voltage levels, the BUF RCV DATA buffered received data signals will have a fixed predetermined voltage level, regardless of the voltage levels of the true and complement RCV DATA receive data signals on the respective lines 30T and 30C.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. A driver for use in transmitting a differential signal pair over a pair of output lines in response to a true and complement data signal comprising:
   A. a differential mode signal generating circuit including true and complement signal generating elements for generating said differential signal pair in tandem for transmission over said pair of output lines, each of said true and complement signal generating elements including an actuable high-gain element and at least one actuable low-gain element which cooperate to generate one signal of said differential signal pair; and
   B. a delay circuit responsive to the true and complement data signal for iteratively controlling the high-gain element and low-gain element of each of said true and complement signal generating elements to effect the generation of the differential signal pair, the delay circuit controlling the actuation of said high-gain element with a delay relative to the actuation of said low-gain element to shape transitions of said differential signal pair to thereby reduce ringing in the differential signal pair.

2. A driver as defined in claim 1 in which each of said true and complement signal generating elements further includes a second actuable low-gain element, the delay circuit actuating one of the low-gain elements in each of said true and complement signal generating elements prior to actuating the high-gain element, and thereafter actuating the second low-gain element.

3. A driver as defined in claim 1 in which each delay circuit comprises an inverter having a selected delay period, each delay circuit being connected to both signal generating elements, each said delay circuit controlling one signal generating element at the beginning of the delay period and the other signal generating element at the end of the delay period.

4. A receiver for receiving a differential receive signal pair, comprising true and complement receive signals having selected conditions over a pair of input lines and in response generating a data output signal comprising:
   A. a differential receiver including:
      i. a threshold voltage generation circuit for generating a threshold voltage;
      ii. a differential amplifier having true and complement input terminals for receiving respective true and complement input signals and for generating in response an output signal at an output terminal having a voltage level representative of the difference between voltage levels of signals at said input terminals;
      iii. a multiplexer circuit arrangement for:
         a. during a receive operating mode, coupling the true and complement receive signals to the input terminals of said differential amplifier, thereby to enable said differential amplifier to generate said output signal in response to said true and complement receive signals; and
         b. during a test operating mode, selectively coupling one of said true or complement receive signals and the threshold voltage as said true and complement input signals to opposing ones of the input terminals of said differential amplifier, thereby to enable said differential amplifier to generate said output signal in response to said true or complement receive signal and the threshold voltage; and
   B. a signal utilization circuit for generating a digital output signal having selected values in response to the output signal from said differential receiver, the data output signal having selected data conditions corresponding to the condition of the differential signal pair during the receive operating mode, and test conditions in response to the voltage levels of the output signal from the differential amplifiers during the test operating mode.

5. A receiver as defined in claim 4 wherein:
   A. said multiplexer circuit arrangement includes:
      i. a true multiplexer connected to, in response to a true data select signal having one of a plurality of predetermined conditions, selectively couple one of said true receive signal or said threshold voltage to one input terminal of said differential amplifier;
      ii. a complement multiplexer connected to, in response to a complement data select signal having one of a plurality of predetermined conditions, selectively couple one of said complement receive signal or said threshold voltage to another input terminal of said differential amplifier
   B. said signal utilization circuit generates said true data select signal and said complement data select signal of selected conditions to, during said receive operating mode, enable both said true and complement multiplexers to couple the true and complement receive signals to respective input terminals of said differential amplifiers, and, during said test operating mode, to enable a selected one of said true or complement multiplexers to couple the respective true or complement receive signal to the respective input terminal and the other of said complement or true multiplexers to couple the respective complement or true receive signal to the respective input terminal and the threshold voltage to the other input terminal.

6. A receiver as defined in claim 4 in which said threshold voltage generation circuit generates a true threshold voltage and a complement threshold voltage, said multiplexer circuit arrangement selectively coupling said true receive signal or said true threshold voltage to one input terminal of said differential amplifier and further coupling said complement receive signal or said complement threshold voltage to another input terminal of said differential amplifier, thereby to enable said differential amplifier to, during said test operating mode, selectively generate said output signal in response to said true receive signal and said complement threshold voltage or in response to said complement receive signal and said true threshold voltage.

7. A receiver as defined in claim 6 in which said threshold voltage generation circuit comprises a true threshold voltage generation circuit and a complement threshold voltage generation circuit, both being controlled by a test select signal from said signal utilization circuit,  A. said true threshold voltage generation circuit comprising a voltage divider comprising two serially-connected true threshold resistors connected between a power supply and a test select signal receiving node, said true threshold voltage being provided by a node interconnecting said true threshold resistors; and  B. said complement threshold voltage generation circuit comprising a voltage divider comprising two serially-connected complement threshold resistors connected between a test select signal receiving node and a ground reference voltage level, said complement threshold voltage being provided by a node interconnecting said complement threshold resistors.

8. A driver as defined in claim 2 in which said delay circuit comprises:

A. a true delay circuit comprising a plurality of inverters connected in series including a first true inverter connected to receive said true data signal and a second true inverter, said first true inverter having an output connected to actuate the high-gain element of said complement signal generating element, the second true inverter connected to actuate the second low-gain element of said true signal generating element; and  B. a complement delay circuit comprising a plurality of inverters connected in series including a first complement inverter connected to receive said complement data signal and a second complement inverter, said first complement inverter having an output connected to actuate the high-gain element of said true signal generating element, the second complement inverter connected to actuate the second low-gain element of said complement signal generating element.

* * * * *